United States Patent
Kim

[19]

[11] Patent Number: 6,002,637
[45] Date of Patent: Dec. 14, 1999

[54] INPUT BUFFER CIRCUIT

[75] Inventor: Kyung Saeng Kim, Chongcheongbuk-Do, Rep. of Korea

[73] Assignee: LG Semicon Co., Ltd., Choongcheongbuk-Do, Rep. of Korea

[21] Appl. No.: 09/160,337

[22] Filed: Sep. 25, 1998

[30]     Foreign Application Priority Data

Dec. 16, 1997 [KR]   Rep. of Korea ...................... 97-69356

[51] Int. Cl.⁶ ....................................................... G11C 8/00
[52] U.S. Cl. .................................. 365/230.08; 365/223.5; 365/189.05
[58] Field of Search ........................... 365/230.08, 223.5, 365/189.05, 189.01, 230.01

[56]           References Cited

U.S. PATENT DOCUMENTS 5,691,953  11/1997  Yeh et al. ........................... 365/230.08
5,706,246   1/1998  Choi et al. .......................... 365/230.08

*Primary Examiner*—Vu A. Le
*Attorney, Agent, or Firm*—Morgan, Lewis & Bockius LLP

[57]          ABSTRACT

An input buffer circuit of a semiconductor memory device in which data is accessed by driving a decoder based on first and second internal address signals, the input buffer circuit including a first circuit for summing an input address and a chip selection signal to generate a first address signal, first and second inverters for inverting the first address signal and generating the first internal address signal and a second address signal, a detector circuit receiving the first internal address signal and the second address signal and detecting a HIGH of the first internal address signal and a LOW of the second address signal, and a second circuit for summing an output of the detection means and the second address signal and generating the second internal address signal.

5 Claims, 4 Drawing Sheets

FIG. 3A BACKGROUND ART (A) ADDR 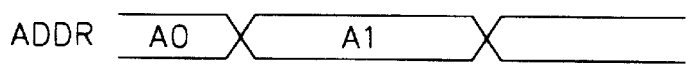
FIG. 3B BACKGROUND ART (B) CSB 
FIG. 3C BACKGROUND ART (C) AN 
FIG. 3D BACKGROUND ART (D) ANB 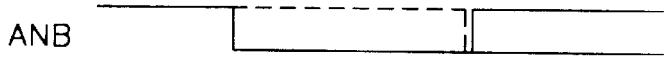
FIG. 3E BACKGROUND ART (E) OUT1 
FIG. 3F BACKGROUND ART (F) OUT2 
FIG. 4
BACKGROUND ART
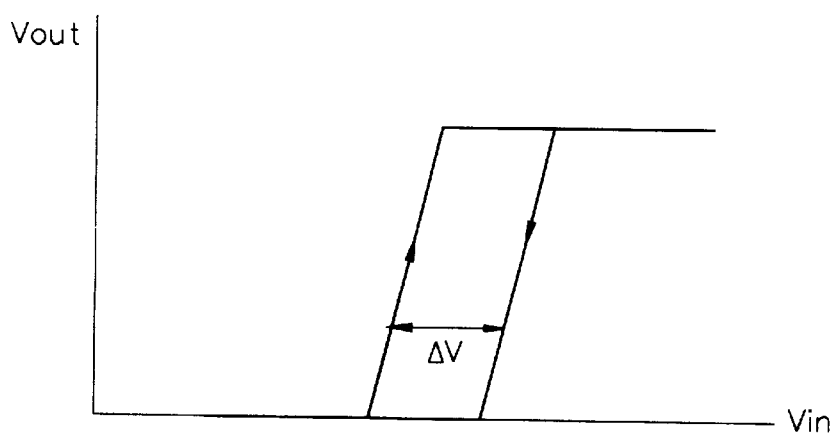

FIG. 7
| AN\ANBI | 0 | 1 |
|---|---|---|
| 0 | 0 | 1 |
| 1 | 0 | 0 |
FIG. 8A    ADDR 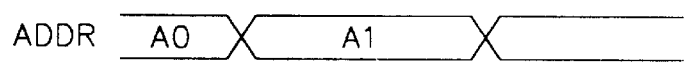
FIG. 8B    CSB 
FIG. 8C    AN 
FIG. 8D    ANBI 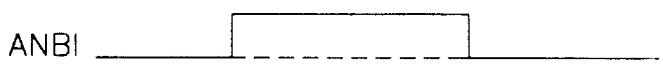
FIG. 8E    NFDO 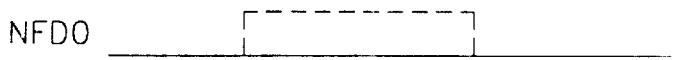
FIG. 8F    ANB 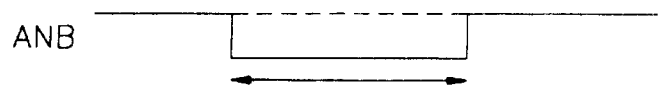

INPUT BUFFER CIRCUIT

This application claims the benefit of Korean patent application No. 97-69356, filed Dec. 16, 1997, which is hereby incorporated by reference.

BACKGROUND OF THE INVENTION

1. Field of the Invention

The present invention relates to an input buffer circuit, and more particularly, to an improved input buffer circuit for stable operation of a memory cell.

2. Discussion of the Related Art

FIG. 1 illustrates the conventional input buffer circuit. The conventional input buffer circuit includes an address buffer 10 for buffering an input address ADDR, and an address signal generator 11 for generating an address transition detection signal ATD and internal address signals AN and ANB for a cell selection based on an output signal ANIB from the address buffer 10.

FIG. 2 illustrates the input buffer circuit. The input buffer circuit includes a NOR-gate NR1 for NORing an input address ADDR and a chip selection signal CSB, inverters I1 and I2 for sequentially inverting output signals from the NOR-gate NR1 and outputting an address signal ANIB, and a PMOS transistor PM1 connected between a power supply voltage VCC terminal and an output terminal of the NOR-gate NR1.

The address signal generator 11 includes inverters I3 and I4 for inverting the output signal ANIB from the address buffer 10 and outputting an address transition detection signal ATD and an internal address signal AN, and inverters I5 and I6 for sequentially inverting the output signal from the address buffer 10 and outputting an internal address signal ANB.

The operation of the conventional input buffer circuit will now be explained with reference to the accompanying drawings.

When the chip is enabled by a LOW chip selection signal CSB as shown in FIG. 3A, the address buffer 10 sequentially inverts the input address ADDR, as shown in FIG. 3B, and outputs an address signal ANIB. The address signal generator 11 inverts the address signal ANIB and outputs the address transition signal ATD and address signals AN and ANB, as shown in FIGS. 3C and 3D.

In addition, the decoder 12 is driven by the address signals AN and ANB and outputs address signals OUT1 and OUT2 as shown in FIGS. 3E and 3F, so that data is outputted from a memory cell 13.

The output signal of the NOR-gate NR1 is frequently in a noise margin range around a transition voltage between the voltage VIL, where an input signal is recognized as LOW, and the voltage VIH, where the input signal is recognized as HIGH.

As a result, around the transition voltage, the NOR-gate NR1 does not output a well-defined output value due to the noise, and outputs of the inverters I1 and I2 become unstable due to the unstable output of the NOR-gate NR1.

In addition, as shown in FIGS. 3C and 3D, the internal address signals AN and ANB become HIGH due to the unstable output ANIB of the inverter I2. When the internal address signals AN and ANB become HIGH, the memory cell 13 is selected, and data in the memory cell 13 may be lost.

Therefore, around the transition voltage, the pull-up PMOS transistor PM1 is added for pulling up the input voltage from the inverter I1 as shown in FIG. 2 in order to stabilize the output of the NOR-gate NR1.

However, a hysteresis effect occurs between an input voltage Vin and an output voltage Vout of the inverter I1 due to the addition of the PMOS transistor PM1, so that the output voltage Vout from the inverter I1 exhibits a characteristic degradation by $\Delta V$.

SUMMARY OF THE INVENTION

Accordingly, the present invention is directed to an input buffer circuit that substantially obviates one or more of the problems due to the limitations and disadvantages of the related art.

One object of the present invention to provide an input buffer circuit which overcomes the problems of the related art.

Another object of the present invention to provide an input buffer circuit for preventing cell data from being selected due to noise when an input address is inputted around a transition voltage.

To achieve these and other advantages and in accordance with the purpose of the present invention, as embodied and broadly described, in accordance with a first aspect of the present invention there is provided an input buffer circuit of a semiconductor memory device in which data is accessed by driving a decoder based on first and second internal address signals, the input buffer circuit including a first circuit for summing an input address and a chip selection signal to generate a first address signal, first and second inverters for inverting the first address signal and generating the first internal address signal and a second address signal, a detector circuit receiving the first internal address signal and the second address signal and detecting a HIGH of the first internal address signal and a LOW of the second address signal, and a second circuit for summing an output of the detection means and the second address signal and generating the second internal address signal.

In another aspect of the present invention there is a semiconductor memory input buffer circuit including a first NOR gate for NORing an input address and a chip selection signal to generate a first address signal, first and second inverters for inverting the first address signal and generating the first internal address signal and a second address signal, a detector for receiving the first internal address signal and the second address signal and detecting a HIGH of the first internal address signal and a LOW of the second address signal, and a second NOR gate for NORing an output of the detector and the second address signal and generating the second internal address signal, wherein the detector including a first NMOS transistor and a first PMOS transistor connected between a power supply voltage VCC and an output terminal for receiving the first internal address signal and the second address signal, second and third NMOS transistors connected between the output terminal and a ground VSS for receiving the first internal address signal and the second address signal, second and third PMOS transistors connected between the output terminal and the ground VSS in parallel with the second and third NMOS transistors for receiving the first internal signal and the second address signal, and a fourth PMOS transistor and a fourth NMOS transistor connected between the output terminal and the ground VSS in parallel with the second and third NMOS transistors.

Additional features and advantages of the present invention will be set forth in the description which follows, and will be apparent from the description, or may be learned by practice of the invention. The objectives and other advantages of the invention will be realized and attained by the structure and process particularly pointed out in the written description as well as in the appended claims.

It is to be understood that both the foregoing general description and the following detailed description are exemplary and explanatory and are intended to provide further explanation of the invention as claimed.

BRIEF DESCRIPTION OF THE ATTACHED DRAWINGS

The accompanying drawings, which are included to provide a further understanding of the invention and are incorporated in and constitute a part of this specification, illustrate embodiments of the invention that together with the description serve to explain the principles of the invention.

In the drawings:

FIGS. 3A through 3F are waveforms of outputs of each element of the circuit of FIG. 2;

FIG. 4 shows a characteristic curve of an inverter having a feedback transistor of the circuit of FIG. 2;

FIG. 7 is a truth table of a detector of the circuit of FIG. 6; and

FIGS. 8A through 8F are waveforms of outputs of each element of the circuit of FIGS. 5 and 6.

DETAILED DESCRIPTION OF THE PREFERRED EMBODIMENTS

Reference will now be made in detail to the preferred embodiments of the present invention, examples of which are illustrated in the accompanying drawings.

Figure 1:
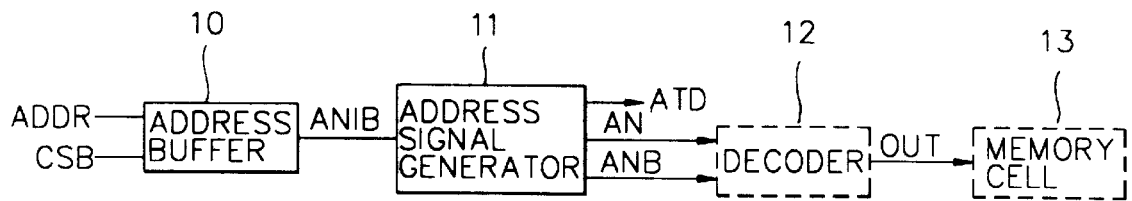
FIG. 1 is a block diagram illustrating a conventional input buffer circuit.
Figure 2:
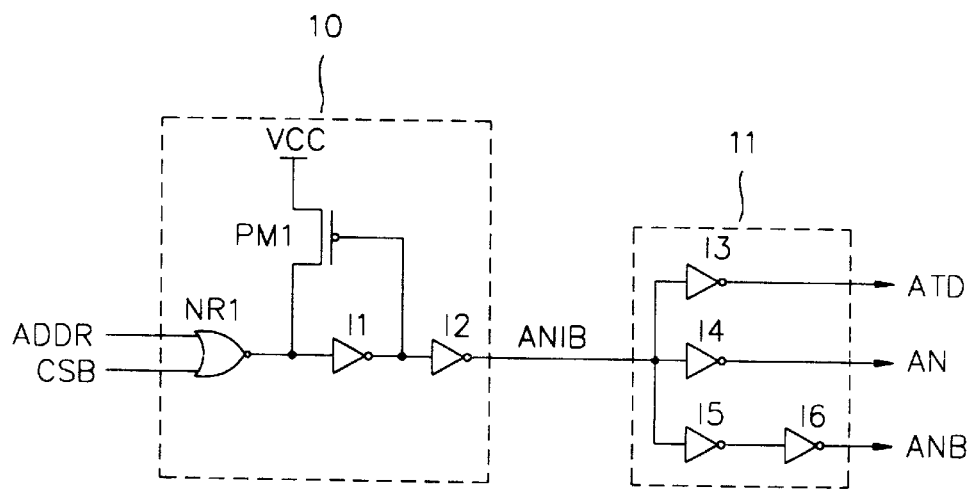
FIG. 2 is a detailed circuit diagram of the circuit of FIG. 1.
Figure 5:
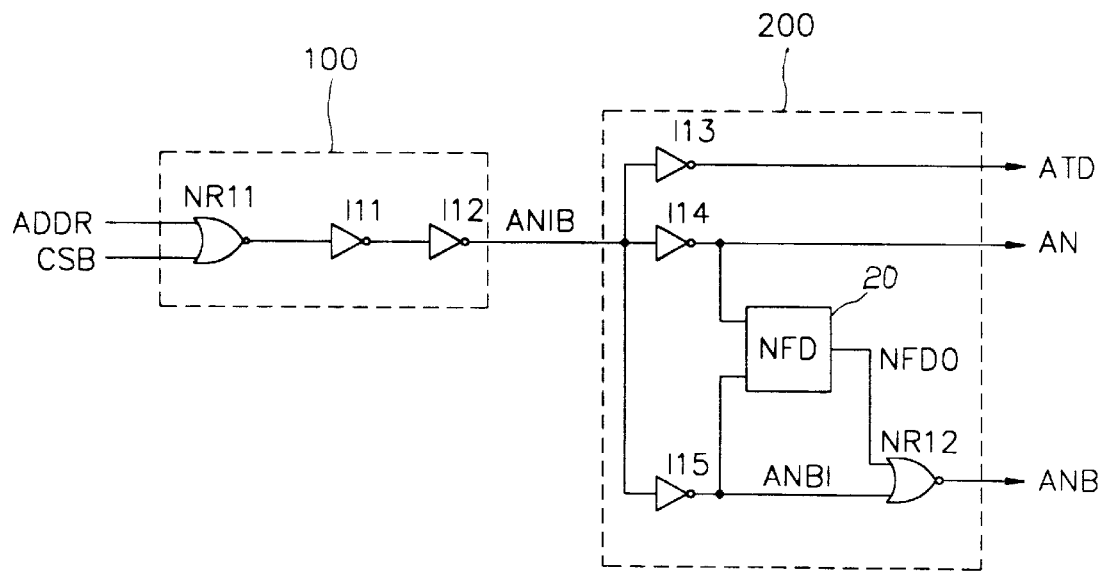
FIG. 5 is a circuit diagram illustrating an input buffer circuit according to the present invention.

As shown in FIG. 5, an input buffer of the present invention includes an address buffer 100 and an address signal generator 200.

The address buffer 100 includes a NOR-gate NR11 for NORing an input address ADDR and a chip selection signal CSB, and inverters I11 and I12 for sequentially inverting an output of the NOR-gate NR11 and outputting an address signal ANIB. The address signal generator 200 includes inverters I13, I14 and I15 for inverting an address signal ANIB and outputting an address transition signal ATD and address signals AN and ANBI, a detector 20 for detecting the levels of the address signals AN and ANBI, and an OR-gate NR12 for NORing an output signal NFDO from the detector 20 and the address signal ANBI and outputting an address signal ANB.

Figure 6:
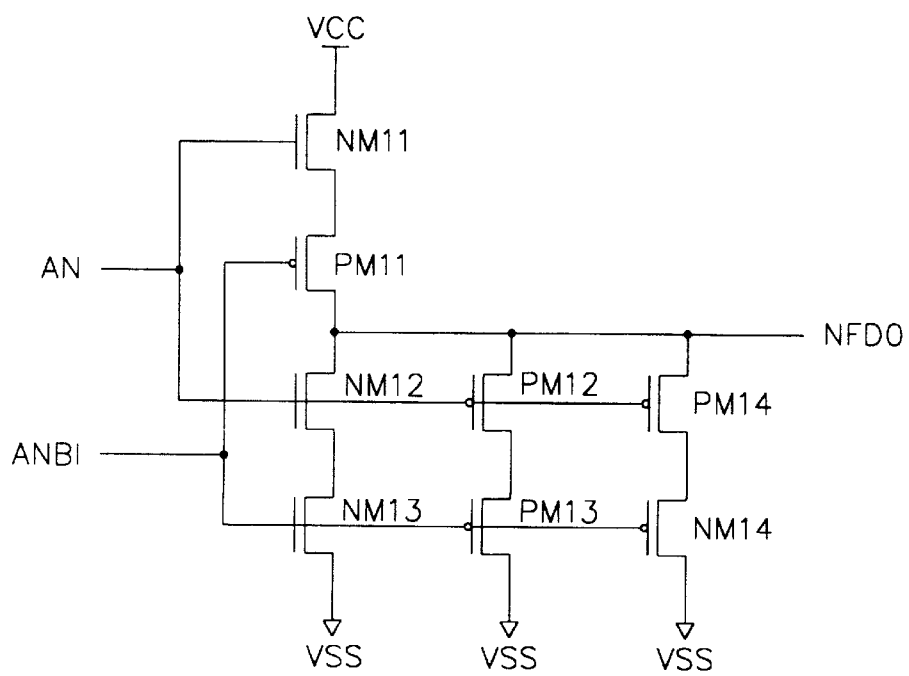
FIG. 6 is a detailed circuit diagram illustrating a detector of the circuit of FIG. 5.

As shown in FIG. 6, the detector 20 includes a first NMOS transistor NM11 and a first PMOS transistor PM11 connected between a power supply voltage VCC and an output terminal for receiving address signals AN and ANBI, and second and third NMOS transistors NM12 and NM13 connected between the output terminal and a ground VSS for receiving the address signals AN and ANBI, second and third PMOS transistors PM12 and PM13 connected between the output terminal and the ground in parallel with the second and third NMOS transistors NM12 and NM13 for receiving the address signals AN and ANBI, and a fourth PMOS transistor PM14 and a fourth NMOS transistor NM14 connected between the output terminal and the ground in parallel with the second and third NMOS transistors NM12 and NM13 for receiving the address signals AN and ANBI.

The operation of the input buffer according to the present invention will now be explained with reference to the accompanying drawings.

First, as shown in FIG. 8B, the chip selection signal CSB is enabled to a LOW, and the input address ADDR is inputted. The address buffer 100 NORs the chip selection signal CSB and the input address ADDR, and then inverts it, outputting the address signal ANIB.

In addition, the address signal ANIB is inverted by the inverters I13, I14 and I15 of the address signal generator 200, and is outputted as an address transition detection signal ATD and the address signals AN and ANBI. The detector 20 receives the address signals AN and ANBI and detects the levels of the address signals AN and ANBI.

If the voltage of the input address ADDR is not close to a transition voltage of the NOR-gate NR11, i.e., it is close to either a HIGH or a LOW, the logic values of the address signals AN and ANB1 are HIGH, and the detection signal NFDO from the detector 20 becomes LOW, as shown in FIG. 8E.

Therefore, as shown in FIG. 8F, the address signal ANB is LOW and has a phase opposite the address signal AN. Thus, an access operation of the memory cell 13 is stably performed.

If the level of the input address is around the transition voltage, the inverters I11 through I15 output noisy and unstable signals that are sensitive to the noise due to the unstable output of the NOR-gate NR11. Thus, a desired internal address signal ANIB is not outputted.

The address signals AN and ANBI have different logic values due to the output address signal ANIB, which is unstable due to the unstable operation of the NOR-gate NR11.

For example, if the address signals AN and ANBI become HIGH and LOW, respectively, due to the unstable address signal ANIB, the first PMOS transistor PM11 and the first NMOS transistor NM11 are turned on, and the detection signal NFDO from the detector 20 becomes HIGH. As a result, the NOR-gate NR12 NORs the HIGH detection signal NFDO and the HIGH address signal ANBI and outputs a LOW address signal ANB. The memory cell 13 is not selected by the LOW address signals AN and ANB. FIG. 7 illustrates the truth table of the comparator 20.

If the address signals AN and ANBI are LOW and HIGH respectively, the fourth NMOS transistor NM14 and the fourth PMOS transistor PM14 are turned on, the detection signal NFDO becomes LOW, and the address signal ANB becomes LOW. Therefore, it is possible to prevent the memory cell 13 from being selected by the HIGH address signals AN and ANB. In other words, a multiple selection problem is prevented.

If the address signals AN and ANBI have different logic values due to the output address signal ANIB, which is unstable due to the unstable operation of the NOR-gate NR11, i.e., if the address signals AN and ANBI are LOW and HIGH, respectively, the address signals AN and ANB are forced to LOW, so that the memory cell 13 is not selected. If the address signals AN and ANBI are HIGH and LOW respectively, the address signal ANB is forced to HIGH, so that the address signal AN becomes HIGH, and the address signal ANB becomes HIGH, and the memory cell 13 is selected.

As described above, when an address is inputted having a voltage close to the transition voltage, the memory cell 13 data is prevented from being selected (and possibly lost) due to the noise from the unstable operation of the NOR-gate. Thus, a multi-selection problem is prevented.

While the invention has been described in detail and with reference to specific embodiments thereof, it will be apparent to one skilled in the art that various changes and modifications can be made therein without departing from the spirit and scope thereof. Thus, it is intended that the present invention cover the modifications and variations of this invention provided they come within the scope of the appended claims and their equivalents.

What is claimed is:

1. An input buffer circuit of a semiconductor memory device in which data is accessed by driving a decoder based on first and second internal address signals, the input buffer circuit comprising:

a first circuit for summing an input address and a chip selection signal to generate a first address signal;

first and second inverters for inverting the first address signal and generating the first internal address signal and a second address signal;

a detector circuit receiving the first internal address signal and the second address signal and detecting a HIGH of the first internal address signal and a LOW of the second address signal; and a second circuit for summing an output of the detection means and the second address signal and generating the second internal address signal.

2. The input buffer circuit of claim 1, wherein the detector circuit includes:

a first NMOS transistor and a first PMOS transistor connected between a power supply voltage VCC and an output terminal for receiving the first internal address signal and the second address signal;

second and third NMOS transistors connected between the output terminal and a ground VSS for receiving the first internal address signal and the second address signal;

second and third PMOS transistors connected between the output terminal and the ground VSS in parallel with the second and third NMOS transistors for receiving the first internal signal and the second address signal; and a fourth PMOS transistor and a fourth NMOS transistor connected between the output terminal and the ground VSS in parallel with the second and third NMOS transistors.

3. The input buffer circuit of claim 1, wherein the first circuit includes a NOR-gate.

4. The input buffer circuit of claim 1, wherein the second internal address signal is LOW when the first internal address signal is LOW and the second address signal is HIGH.

5. A semiconductor memory input buffer circuit comprising:

first NOR gate for NORing an input address and a chip selection signal to generate a first address signal;

first and second inverters for inverting the first address signal and generating the first internal address signal and a second address signal;

a detector for receiving the first internal address signal and the second address signal and detecting a HIGH of the first internal address signal and a LOW of the second address signal; and a second NOR gate for NORing an output of the detector and the second address signal and generating the second internal address signal, wherein the detector includes:

a first NMOS transistor and a first PMOS transistor connected between a power supply voltage VCC and an output terminal for receiving the first internal address signal and the second address signal;

second and third NMOS transistors connected between the output terminal and a ground VSS for receiving the first internal address signal and the second address signal;

second and third PMOS transistors connected between the output terminal and the ground VSS in parallel with the second and third NMOS transistors for receiving the first internal signal and the second address signal; and a fourth PMOS transistor and a fourth NMOS transistor connected between the output terminal and the ground VSS in parallel with the second and third NMOS transistor.

* * * * *